(12) United States Patent  (10) Patent No.: US 7,859,311 B2
Bertin                     (45) Date of Patent: *Dec. 28, 2010

(54) INTEGRATED NANOTUBE AND FIELD EFFECT SWITCHING DEVICES

(75) Inventor: Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/506,525

(22) Filed: Jul. 21, 2009

(65) Prior Publication Data

US 2009/0295431 A1    Dec. 3, 2009

Related U.S. Application Data

(63) Continuation of application No. 11/929,076, filed on Oct. 30, 2007, now Pat. No. 7,564,269, which is a continuation of application No. 11/033,089, filed on Jan. 10, 2005, now Pat. No. 7,288,970.

(60) Provisional application No. 60/581,015, filed on Jun. 18, 2004.

(51) Int. Cl.
    *H03K 19/094*    (2006.01)
(52) U.S. Cl. .................. 326/120; 326/136; 977/700
(58) Field of Classification Search ................ 326/1–2, 326/12–114, 120, 136; 977/700, 940
    See application file for complete search history.

(56) References Cited

U.S. PATENT DOCUMENTS 6,128,214 A    10/2000    Kuekes et al.
6,256,767 B1    7/2001    Kuekes et al.
7,049,625 B2 *    5/2006    Kern et al. ................. 257/9
2004/0031975 A1    2/2004    Kern et al.
2005/0062035 A1 *    3/2005    Bertin et al. ................ 257/20

OTHER PUBLICATIONS

Lin, Y. et al. "Novel Carbon Nanotube FET Design with Tunable Polarity," IEDM 04-0687, 29.2.1-29.2.4, 2004.
Luyken, R.J. et al., "Concepts for hybrid CMOS-molecular non-volatile memories," Nanotechnology 14 (2003) 273-276.

* cited by examiner

*Primary Examiner*—James Cho
(74) *Attorney, Agent, or Firm*—Wilmer Cutler Pickering Hale and Dorr LLP

(57) ABSTRACT

Hybrid switching devices integrate nanotube switching elements with field effect devices, such as NFETs and PFETs. A switching device forms and unforms a conductive channel from the signal input to the output subject to the relative state of the control input. In embodiments of the invention, the conductive channel includes a nanotube channel element and a field modulatable semiconductor channel element. The switching device may include a nanotube switching element and a field effect device electrically disposed in series. According to one aspect of the invention, an integrated switching device is a four-terminal device with a signal input terminal, a control input terminal, a second input terminal, and an output terminal. The devices may be non-volatile. The devices can form the basis for a hybrid NT-FET logic family and can be used to implement any Boolean logic circuit.

17 Claims, 7 Drawing Sheets

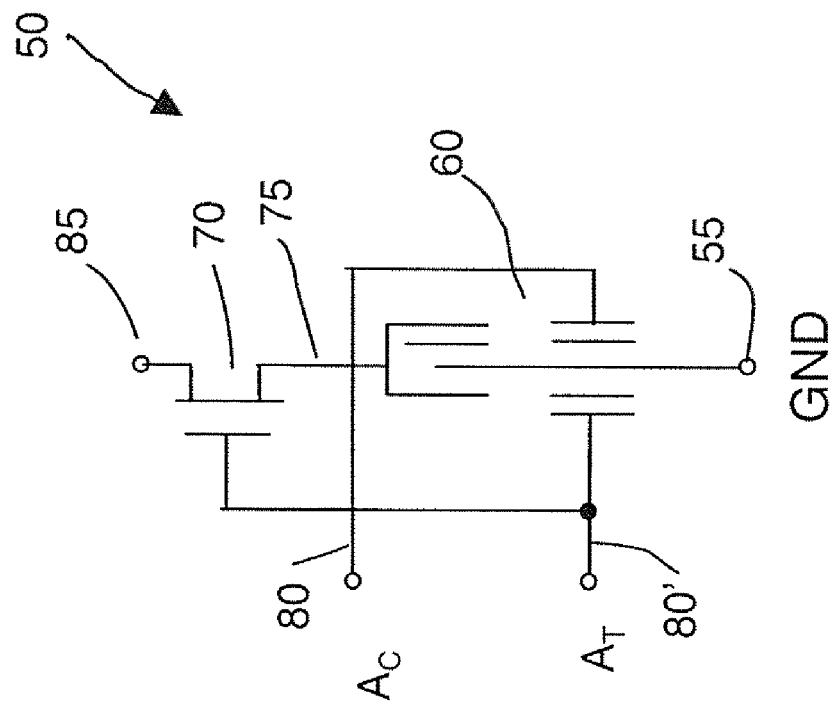
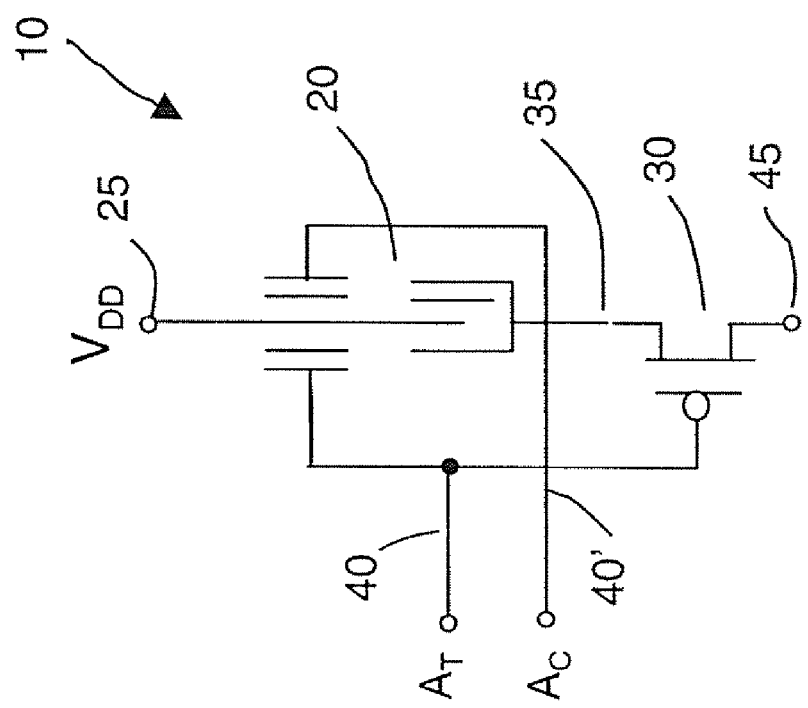
Figure 1A
Figure 1B

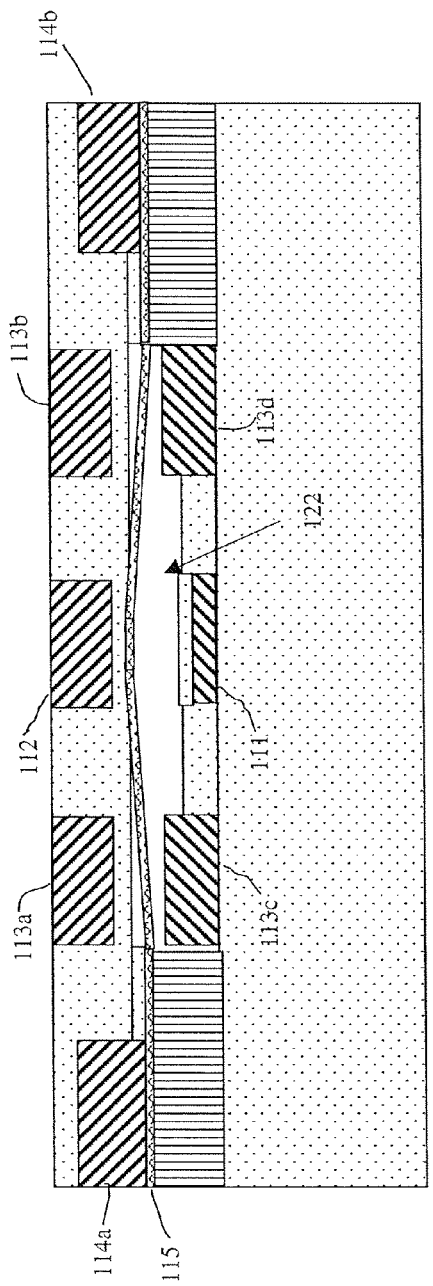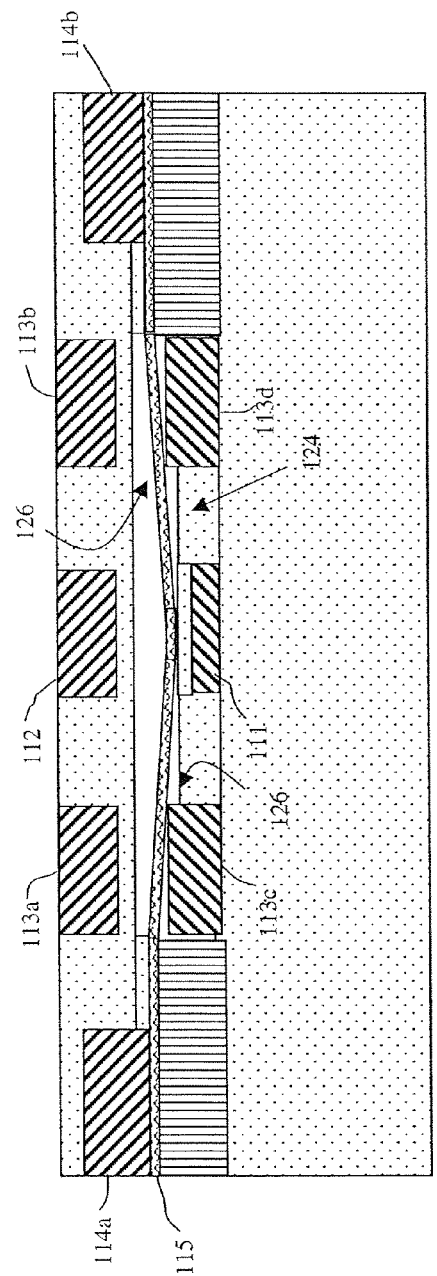

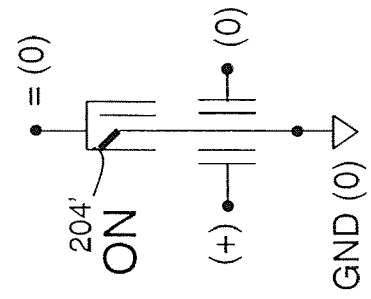
Figure 2C
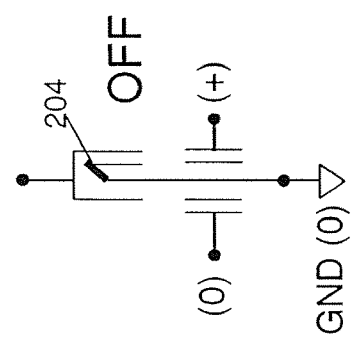
Figure 3C
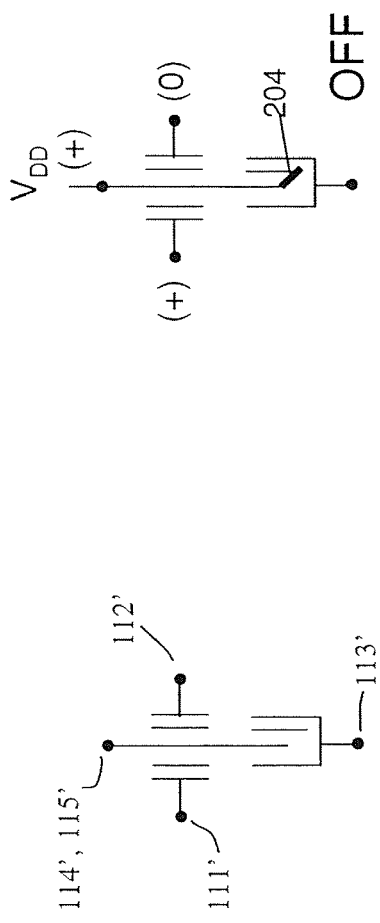
Figure 2B
Figure 3B
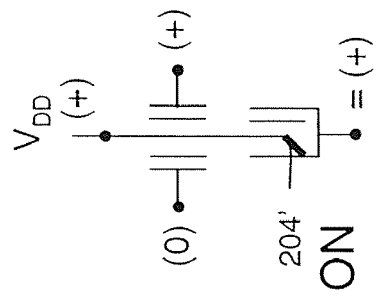
Figure 2A
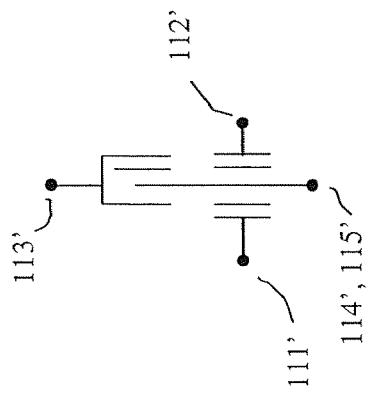
Figure 3A

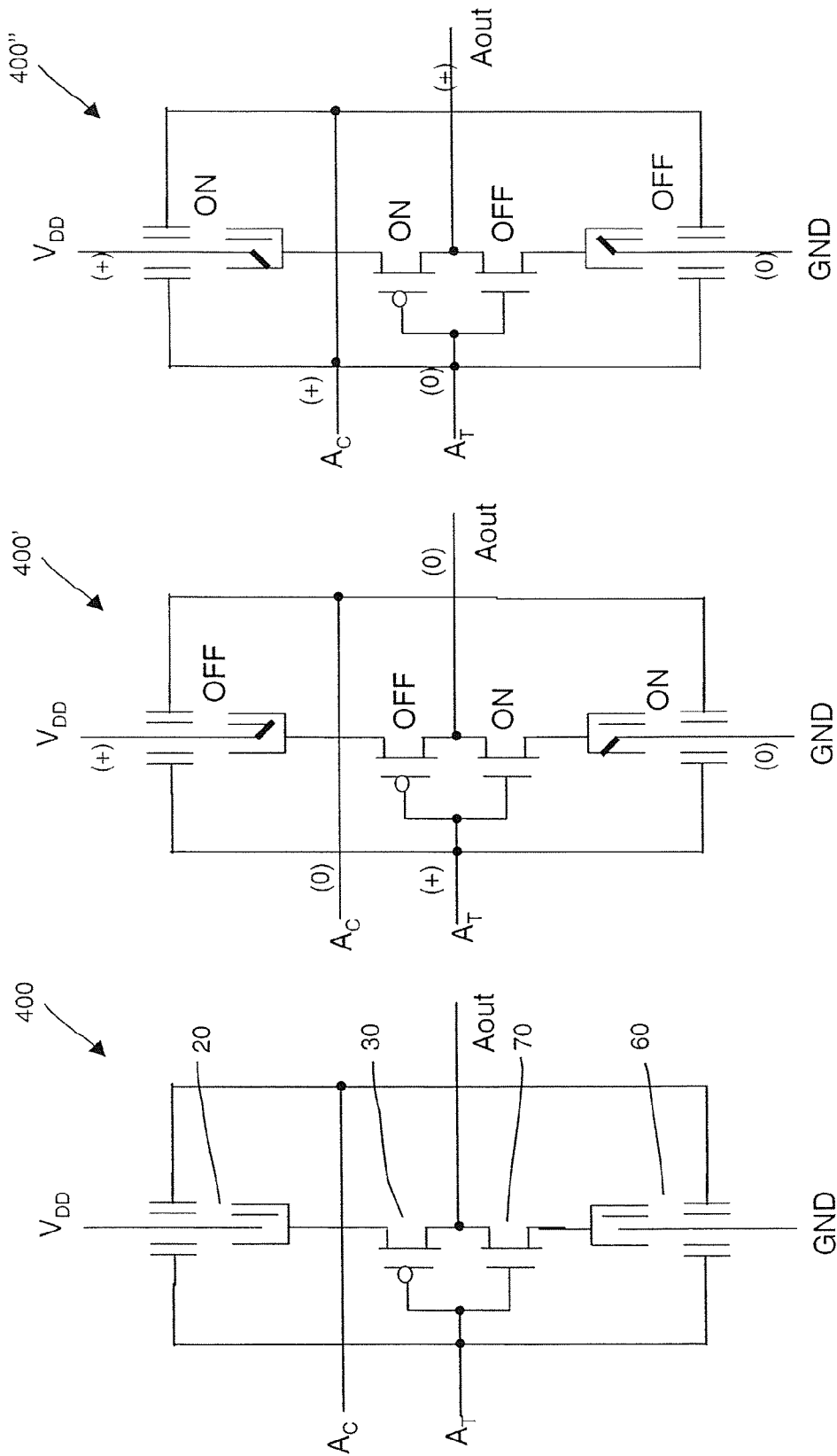

INTEGRATED NANOTUBE AND FIELD EFFECT SWITCHING DEVICES

CROSS-REFERENCE TO RELATED APPLICATIONS

This application is a continuation of and claims priority under 35 U.S.C. §120 to U.S. patent application Ser. No. 11/929,076, filed on Oct. 30, 2007, entitled, Integrated Nanotube and Field Effect Switching Device, now U.S. Pat. No. 7,564,269, which is a continuation of and claims priority under 35 U.S.C. §120 to U.S. patent application Ser. No. 11/033,089, filed on Jan. 10, 2005, entitled, Integrated Nanotube and Field Effect Switching Device, now U.S. Pat. No. 7,288,970, which claims priority under 35 U.S.C. §119(e) to U.S. Provisional Pat. Apl., Ser. No. 60/581,015, filed on Jun. 18, 2004, entitled Nonvolatile Carbon Nanotube Logic (NLOGIC) and CMOS Inverter, the entire contents of which are incorporated herein by reference.

This application is related to the following applications:

U.S. patent application Ser. No. 10/917,794, filed on Aug. 13, 2004, entitled Nanotube-Based Switching Elements;

U.S. patent application Ser. No. 10/918,085, filed on Aug. 13, 2004, entitled Nanotube-Based Switching Elements With Multiple Controls;

U.S. patent application Ser. No. 10/918,181, filed on Aug. 13, 2004, entitled Nanotube Device Structure And Methods Of Fabrication;

U.S. patent application Ser. No. 10/917,893, filed on Aug. 13, 2004, entitled Nanotube-Based Switching Elements And Logic Circuits;

U.S. patent application Ser. No. 10/917,606, filed on Aug. 13, 2004, entitled Isolation Structure For Deflectable Nanotube Elements;

U.S. patent application Ser. No. 10/917,932, filed on Aug. 13, 2004, entitled Circuits Made From Nanotube-Based Switching Elements With Multiple Controls;

U.S. patent application Ser. No. not yet assigned, filed on date even herewith entitled, Nanotube-Based Transfer Devices and Related Circuits;

U.S. patent application Ser. No. not yet assigned, filed on date even herewith entitled, Receiver Circuit Using Nanotube-Based Switches and Transistors;

U.S. patent application Ser. No. not yet assigned, filed on date even herewith entitled, Receiver Circuit Using Nanotube-based Switches and Logic;

U.S. patent application Ser. No. not yet assigned, filed on date even herewith entitled, Nanotube-based Logic Driver Circuits;

U.S. patent application Ser. No. not yet assigned, filed on date even herewith entitled, Storage Elements Using Nanotube Switching Elements; and U.S. patent application Ser. No. not yet assigned, filed on date even herewith entitled, Tri-State Circuit Using Nanotube Switching Elements.

BACKGROUND

1. Technical Field

The present invention generally relates to switching elements and logic circuits, and in particular to switching elements that integrate nanotube switching technology, in which nanotubes provide conductive channels in switches, with field effect switching technology and logic circuits formed therefrom.

2. Discussion of Related Art

Digital logic circuits are used in personal computers, portable electronic devices such as personal organizers and calculators, electronic entertainment devices, and in control circuits for appliances, telephone switching systems, automobiles, aircraft and other items of manufacture. Early digital logic was constructed out of discrete switching elements composed of individual bipolar transistors. With the invention of the bipolar integrated circuit, large numbers of individual switching elements could be combined on a single silicon substrate to create complete digital logic circuits such as inverters, NAND gates, NOR gates, flip-flops, adders, etc. However, the density of bipolar digital integrated circuits is limited by their high power consumption and the ability of packaging technology to dissipate the heat produced while the circuits are operating. The availability of metal oxide semiconductor ("MOS") integrated circuits using field effect transistor ("FET") switching elements significantly reduces the power consumption of digital logic and enables the construction of the high density, complex digital circuits used in current technology. The density and operating speed of MOS digital circuits are still limited by the need to dissipate the heat produced when the device is operating.

Digital logic integrated circuits constructed from bipolar or MOS devices do not function correctly under conditions of high heat or heavy radiation. Current digital integrated circuits are normally designed to operate at temperatures less than 100 degrees centigrade and few operate at temperatures over 200 degrees centigrade. In conventional integrated circuits, the leakage current of the individual switching elements in the "off" state increases rapidly with temperature. As leakage current increases, the operating temperature of the device rises, the power consumed by the circuit increases, and the difficulty of discriminating the off state from the on state reduces circuit reliability. Conventional digital logic circuits also short internally when subjected to heavy radiation because the radiation generates electrical currents inside the semiconductor material. It is possible to manufacture integrated circuits with special devices and isolation techniques so that they remain operational when exposed to heavy radiation, but the high cost of these devices limits their availability and practicality. In addition, radiation hardened digital circuits exhibit timing differences from their normal counterparts, requiring additional design verification to add radiation protection to an existing design.

Integrated circuits constructed from either bipolar or FET switching elements are volatile. They only maintain their internal logical state while power is applied to the device. When power is removed, the internal state is lost unless some type of non-volatile memory circuit, such as EEPROM (electrically erasable programmable read-only memory), is added internal or external to the device to maintain the logical state. Even if non-volatile memory is utilized to maintain the logical state, additional circuitry is necessary to transfer the digital logic state to the memory before power is lost, and to restore the state of the individual logic circuits when power is restored to the device. Alternative solutions to avoid losing information in volatile digital circuits, such as battery backup, also add cost and complexity to digital designs.

Important characteristics for logic circuits in an electronic device are low cost, high density, low power, and high speed. Resistance to radiation and the ability to function correctly at elevated temperatures also expand the applicability of digital logic. Conventional logic solutions are limited to silicon substrates, but logic circuits built on other substrates would allow logic devices to be integrated directly into many manufactured products in a single step, further reducing cost.

Devices have been proposed which use nanoscopic wires, such as single-walled carbon nanotubes (NT), to form crossbar junctions to serve as memory cells. (See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul. 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

U.S. Patent Publication No. 2003-0021966 discloses, among other things, electromechanical circuits, such as memory cells, using nanotube ribbons. Such circuits include a structure having electrically conductive traces and supports extending from a surface of a substrate. Nanotube ribbons that can electromechanically deform, or switch, are suspended by the supports that cross the electrically conductive traces. Each ribbon comprises one or more nanotubes. The ribbons are typically formed by selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which two of the traces are electrodes to control the deflection of the ribbon.

The use of an electromechanical bi-stable device for digital information storage has also been suggested (c.f. U.S. Pat. No. 4,979,149: Non-volatile memory device including a micro-mechanical storage element).

The creation and operation of bi-stable, nano-electro-mechanical switches based on carbon nanotubes (including mono-layers constructed thereof) and metal electrodes has been detailed in previous patent applications of Nantero, Inc. (U.S. Pat. Nos. 6,574,130, 6,643,165, 6,706,402; U.S. patent application Ser. Nos. 09/915,093, 10/033,323, 10/033,032, 10/128,117, 10/341,005, 10/341,055, 10/341,054, 10/341,130, 10/776,059, 10/776,572, 10/917,794, and 10/918,085 the contents of which are hereby incorporated by reference in their entireties).

BRIEF DESCRIPTION OF THE DRAWINGS

FIG. 1A is a schematic representation of an non-volatile integrated nanotube switching element and PFET device (or NT-PFET device) according to one aspect of the invention;

FIG. 1B is a schematic representation of an non-volatile integrated nanotube switching element and NFET device (or NT-NFET device) according to one aspect of the invention;

FIGS. 1E and 1F illustrate cross sectional views of different positional and electrical states of a nanotube switching element fabricated according to preferred embodiments of the invention;

FIGS. 2A-C and 3A-C are schematic representations of nanotube switching element 100 of FIG. 1C in pull-up and pull-down configurations, respectively;

FIG. 4A is a schematic representation of an inverter constructed using a non-volatile integrated NT-PFET device and a non-volatile integrated NT-NFET device as shown in FIGS. 1A and 1B, according to one aspect of the invention;

FIG. 4B is a schematic representation of the inverter of FIG. 4A in one possible logic state;

FIG. 4C is a schematic representation of the inverter of FIG. 4A in one possible logic state;

SUMMARY OF THE INVENTION

Figure 1C:
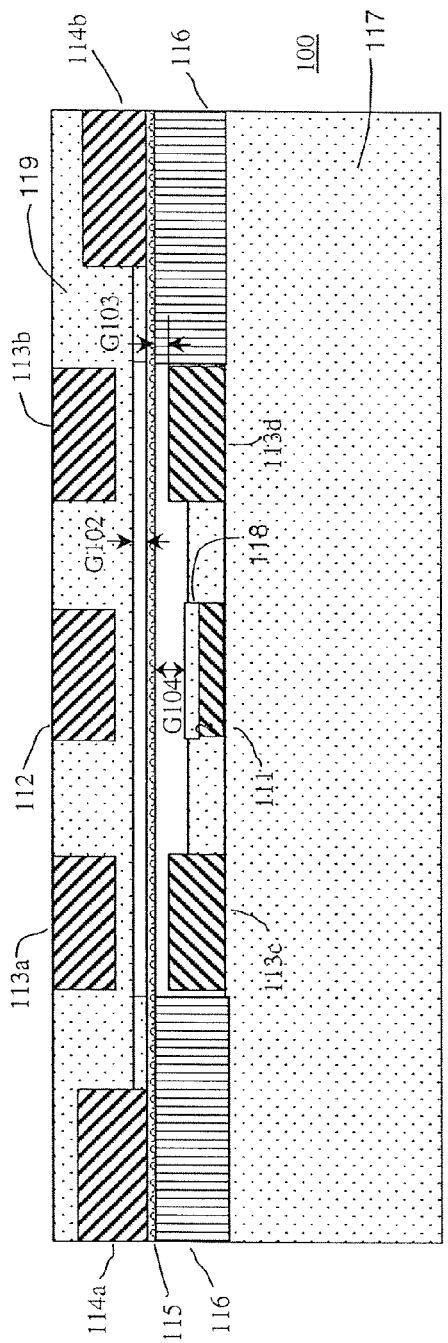
FIGS. 1C and 1D illustrate a cross sectional and plan views of a nanotube switching element fabricated according to preferred embodiments of the invention.

Embodiments of the present invention provide integrated switching devices that combine nanotube (NT) switching elements with field effect semiconductor elements, including but not limited to MOS NFETs and PFETs (FETs).

According to one aspect of the invention, nanotube switching elements are integrated with field effect devices to form hybrid switching devices that are non-volatile.

According to one aspect of the invention, an integrated switching device is a multi-terminal device, with a signal input terminal, at least one control input terminal and an output terminal. An integrated switching device forms and unforms a conductive channel from the signal input to the output subject to the relative state of the control input. The conductive channel includes a nanotube channel element and a field modulatable semiconductor channel element.

According to one aspect of the invention, an integrated switching device is a four-terminal device with two control input terminals, a signal input terminal, and an output terminal.

According to one aspect of the invention, an integrated switching device includes a nanotube switching element and a field effect device interconnected in series. The field effect device may resemble a field effect transistor. A control input node of the nanotube switching element and the gate of the field effect device are logically tied together.

According to one aspect of the invention, an integrated switching device includes a nanotube switching element and a field effect device arranged to limit the leakage current.

According to one aspect of the invention, an integrated switching device includes a network of nanotube switching elements and/or field effect devices.

According to one aspect of the invention, integrated switching devices including a nanotube switching element and a field effect device are used to form logic circuits.

According to one aspect of the invention, an integrated switching device including a nanotube switching element and a field effect device is connected to a power supply and provides a pull-up device.

According to one aspect of the invention, an integrated switching device including a nanotube switching element and a field effect device is connected to ground and provides a pull-down device.

According to one aspect of the invention, an integrated switching device including a nanotube switching element and a field effect device is arranged so that a field effect transistor is proximate to the output terminal.

According to one aspect of the invention, an integrated switching device including a nanotube switching element and a field effect device is arranged so that a nanotube switching element is proximate to the signal input terminal.

According to one aspect of the invention, integrated switching devices including a nanotube switching element and a field effect device are used to provide a device family to implement logic functions.

According to one aspect of the invention, integrated switching devices including a nanotube switching element and a field effect device are used to provide a complementary logic scheme to implement logic functions.

According to one aspect of the invention, integrated switching devices including a nanotube switching element and a field effect device are used to construct dual-rail single-output circuits.

According to one aspect of the invention, integrated switching devices including a nanotube switching element and a field effect device are used to construct dual-rail dual-output circuits.

According to one aspect of the invention, integrated switching devices including a nanotube switching element and a field effect device are used to form logic circuits to implement Boolean operations. A Boolean logic circuit includes at least one input terminal and an output terminal and a network of integrated switching elements including a nanotube switching element and a field effect device electrically disposed between the at least one input terminal and the output terminal. The network performs a Boolean transformation of Boolean signals on the at least one input terminal.

According to one aspect of the invention, circuits using integrated switching devices including a nanotube switching element and a field effect transistor have driving capabilities comparable to CMOS.

According to one aspect of the invention, circuits using integrated switching devices including a nanotube switching element and a field effect transistor are CMOS compatible.

DETAILED DESCRIPTION

Embodiments of the invention provide switching elements with a conductive channel that has both a nanotube component and a field effect semiconductor component. Preferred embodiments of the invention provide integrated hybrid logic devices that use nanotube switching elements in combination with field effect devices resembling field effect transistors (FETs). The integrated devices are referred to herein as NT-FET devices. The NT-FET devices of preferred embodiments form an NT-FET device family. The devices in the NT-FET device family can be used as switching elements and to implement any desired logic function or logical device, such as an inverter. In certain embodiments, an NT-FET device includes a MOSFET, e.g., a p-channel FET (PFET) or an n-channel FET (NFET), placed in series with a nanotube switching element connected to a source ($V_{DD}$ or GND). In preferred embodiments, the gate of the FET is logically tied to a control input of the nanotube switching element. In some embodiments, the source may also be a signal such as an output from other logic. More complex integrated NT-FET devices may include an FET network and/or a nanotube switching element network, rather than a single nanotube switching element and a single FET. The NT-FET devices may exhibit certain desirable characteristics, such as the ability to drive different types of circuits, including CMOS circuits, and low leakage currents. In preferred embodiments, the NT-FET devices are non-volatile.

FIG. 1A illustrates an integrated non-volatile nanotube switch and PFET device 10, referred to as a non-volatile NT-PFET device 10, connected in a pull-up arrangement. Non-volatile NT-PFET device 10 is a four-terminal device. Non-volatile NT-PFET device 10 has two control input terminals 40 and 40' and an output terminal 45. Non-volatile NT-PFET device 10 also has a signal input terminal 25. In the illustrated embodiment, NT-PFET device 10 is tied to a power source, $V_{DD}$, at signal input terminal 25. In alternate embodiments, NT-PFET device 10 may also be connected to some other type of input signal, e.g., an output from another logic device or circuit, in place of the power supply. In the illustrated embodiment, the two control inputs 40 and 40' are connected to complementary input signals $A_T$ and $A_C$. As used herein, "T" designates a "true" signal and "C" designates its complement. This designation indicates a preferred mode of operation (dual-rail differential input) for the device. In alternate embodiments, PFET device 30 may be connected to signal input terminal 25 and nanotube switching element 20 may be connected to output 45.

The non-volatile NT-PFET device 10 includes a non-volatile nanotube switching element 20 and a PFET device 30. The construction and operation of non-volatile nanotube switching element 20 is described in more detail below. In preferred embodiments, the conductive channel element of non-volatile nanotube switching element 20 is formed of a porous nanotube fabric. Non-volatile nanotube switching element 20 has an input electrode, which is the input signal contact for the nanotube channel element. The input electrode of non-volatile nanotube switching element 20 forms the signal input terminal 25 of NT-PFET device 10, which is connected to $V_{DD}$. The non-volatile nanotube switching element 20 output is connected to the source of PFET device 30 at common terminal 35. Non-volatile nanotube switching element 20 also has a control structure, including two control input terminals, for controlling the channel formation of the switching element. The control input terminals are referred to herein as a control or set electrode and a release electrode. The set electrode of non-volatile nanotube switch 20 is connected to the gate of PFET device 30 to form a common control node at control input terminal 40, which is activated by input $A_T$. Control input terminal 40' is connected to the release electrode of switch 20, and is activated by input $A_C$, the complement of input $A_T$. The drain of PFET device 30 forms the output of non-volatile NT-PFET device 10 at node 45.

FIG. 1B illustrates an integrated non-volatile nanotube switch and NFET device 50, referred to as a non-volatile NT-NFET device 50, connected in a pull-down arrangement. Non-volatile NT-NFET device 50 is a four-terminal device. Non-volatile NT-NFET device 50 has two control input terminals 80 and 80' and an output terminal 85. Non-volatile NT-NFET device 50 also has a signal input terminal 55. In the illustrated embodiment, NT-NFET device 50 is grounded at signal input terminal 55. In alternate embodiments, NT-NFET device 50 may also be connected to some other type of input signal, e.g., an output from another logic device or circuit, rather than being grounded. In the illustrated embodiment, the two control terminals 80 and 80' are connected to complementary input signals $A_T$ and $A_C$.

The non-volatile NT-NFET device 50 includes a non-volatile nanotube switching element 60 and a NFET device 70. The construction of non-volatile nanotube switching element 60 is similar to that of nanotube switching element 20 and is described in more detail below. In preferred embodiments, the conductive channel element of non-volatile nanotube switch 60 is formed of a porous nanotube fabric. Non-volatile nanotube switch 60 has an input electrode, which is the input signal contact with the nanotube channel element. The input electrode of non-volatile nanotube switch 60 forms the signal input terminal 55 of NT-NFET device 50, which is grounded. The non-volatile nanotube switching element 60 output is connected to the source of NFET device 70 at common terminal 75. Non-volatile nanotube switching element 60 also has a control structure with two control input terminals for controlling the switching of the element. The set electrode of non-volatile nanotube switching element 60 is connected to the gate of NFET device 70 to form a common node at control input terminal 80', which is activated by input $A_T$. Control input terminal 80 is connected to the release node of switching element 60, and is activated by input $A_C$. The drain of NFET device 70 forms the output of non-volatile NT-NFET device 50 at output terminal 85.

FIG. 1C is a cross sectional view of a preferred nanotube switching element 100. Nanotube switching element includes a lower portion having an insulating layer 117, control electrode 111, and output electrodes 113*c,d*. Nanotube switching element further includes an upper portion having release electrode 112, output electrodes 113*a,b*, and signal electrodes 114*a,b*. A nanotube channel element 115 is positioned between and held by the upper and lower portions.

Release electrode 112 is made of conductive material and is separated from nanotube channel element 115 by an insulating material 119. The channel element 115 is separated from the facing surface of insulator 119 by a gap height G102.

Output electrodes 113*a,b* are made of conductive material and are separated from nanotube channel element 115 by insulating material 119.

Output electrodes 113*c,d* are likewise made of conductive material and are separated from nanotube channel element 115 by a gap height G103. Notice that the output electrodes 113*c,d* are not covered by insulator.

Control electrode 111 is made of conductive material and is separated from nanotube channel element 115 by an insulating layer (or film) 118. The channel element 115 is separated from the facing surface of insulator 118 by a gap height G104.

Signal electrodes 114*a,b* each contact the nanotube channel element 115 and can therefore supply whatever signal is on the signal electrode to the channel element 115. This signal may be a fixed reference signal (e.g., $V_{DD}$ or Ground) or varying (e.g., a Boolean discrete value signal that can change). Only one of the electrodes 114*a,b* need be connected, but both may be used to reduce effective resistance.

Nanotube channel element 115 is a lithographically-defined article made from a porous fabric of nanotubes (more below). It is electrically connected to signal electrodes 114*a, b*. The electrodes 114*a,b* and support 116 pinch or hold the channel element 115 at either end, and it is suspended in the middle in spaced relation to the output electrodes 113*a-d* and the control electrode 111 and release electrode 112. The spaced relationship is defined by the gap heights G102-G104 identified above. For certain embodiments, the length of the suspended portion of channel element 115 is about 300 to 350 nm.

Under certain embodiments the gaps G103, G104, G102 are in the range of 5-30 nm. The dielectric on terminals 112, 111, and 113*a* and 113*b* are in the range of 5-30 nm, for example. The carbon nanotube fabric density is approximately 10 nanotubes per 0.2×0.2 um area, for example. The suspended length of the nanotube channel element is in the range of 300 to 350 nm, for example. The suspended length to gap ratio is about 5 to 15 to 1 for non-volatile devices, and less than 5 for volatile operation, for example.

Figure 1D:
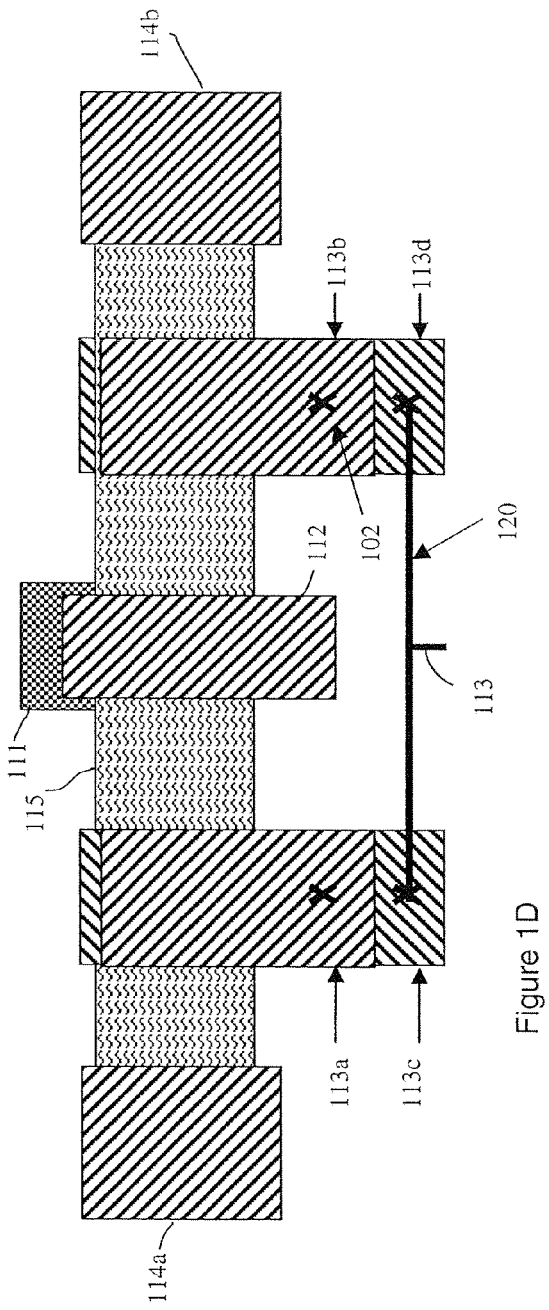

FIG. 1D is a plan view or layout of nanotube switching element 100. As shown in this figure, electrodes 113*b,d* are electrically connected as depicted by the notation 'X' and item 102. Likewise electrodes 113*a,c* are connected as depicted by the 'X'. In preferred embodiments the electrodes are further connected by connection 120. All of the output electrodes collectively form an output node 113 of the switching element 100.

Under preferred embodiments, the nanotube switching element 100 of FIGS. 1C and 1D operates as shown in FIGS. 1E and F. Specifically, nanotube switching element 100 is in an OPEN (OFF) state when nanotube channel element is in position 122 of FIG. 1E. In such state, the channel element 115 is drawn into mechanical contact with dielectric layer 119 via electrostatic forces created by the potential difference between electrode 112 and channel element 115. Output electrodes 113*a,b* are in mechanical contact (but not electrical contact) with channel element 115. Nanotube switching element 100 is in a CLOSED (ON) state when channel element 115 is elongated to position 124 as illustrated in FIG. 1F. In such state, the channel element 115 is drawn into mechanical contact with dielectric layer 118 via electrostatic forces created by the potential difference between electrode 111 and channel element 115. Output electrodes 113*c,d* are in mechanical contact and electrical contact with channel element 115 at regions 126. Consequently, when channel element 115 is in position 124, signal electrodes 114*a* and 114*b* are electrically connected with output terminals 113*c,d* via channel element 115, and the signal on electrodes 114 *a,b* may be transferred via the channel (including channel element 115) to the output electrodes 113*c,d*.

By properly tailoring the geometry of nanotube switching element 100, the nanotube switching element 100 may be made to behave as a non-volatile or a volatile switching element. By way of example, the device state of FIG. 1F may be made to be non-volatile by proper selection of the length of the channel element relative to the gap G104. (The length and gap are two parameters in the restoring force of the elongated, deflected channel element 115.) Length to gap ratios of greater than 5 and less than 15 are preferred for non-volatile device; length to gap ratios of less than 5 are preferred for volatile devices.

The nanotube switching element 100 operates in the following way. If signal electrode 114 and control electrode 111 (or 112) have a potential difference that is sufficiently large (via respective signals on the electrodes), the relationship of signals will create an electrostatic force that is sufficiently large to cause the suspended, nanotube channel element 115 to deflect into mechanical contact with electrode 111 (or 112). (This aspect of operation is described in the incorporated patent references.) This deflection is depicted in FIGS. 1F (and 1E). The attractive force stretches and deflects the nanotube fabric of channel element 115 until it contacts the insulated region 118 of the electrode 111. The nanotube channel element is thereby strained, and there is a restoring tensile force, dependent on the geometrical relationship of the circuit, among other things.

By using appropriate geometries of components, the switching element 100 then attains the closed, conductive state of FIG. 1F in which the nanotube channel 115 mechanically contacts the control electrode 111 and also output electrode 113*c,d*. Since the control electrode 111 is covered with insulator 118 any signal on electrode 114 is transferred from the electrode 114 to the output electrode 113 via the nanotube channel element 115. The signal on electrode 114 may be a varying signal, a fixed signal, a reference signal, a power supply line, or ground line. The channel formation is controlled via the signal applied to the electrode 111 (or 112). Specifically the signal applied to control electrode 111 needs to be sufficiently different in relation to the signal on electrode 114 to create the electrostatic force to deflect the nanotube channel element to cause the channel element 115 to deflect and to form the channel between electrode 114 and output electrode 113, such that switching element 100 is in the CLOSED (ON) state.

In contrast, if the relationship of signals on the electrode 114 and control electrode 111 is insufficiently different, then the nanotube channel element 115 is not deflected and no conductive channel is formed to the output electrode 113. Instead, the channel element 115 is attracted to and physically contacts the insulation layer on release electrode 112. This OPEN (OFF) state is shown in FIG. 1E. The nanotube channel element 115 has the signal from electrode 114 but this signal is not transferred to the output node 113. Instead, the state of the output node 113 depends on whatever circuitry it is connected to and the state of such circuitry. The state of output node 113 in this regard is independent of channel element voltage from signal electrode 114 and nanotube channel element 115 when the switching element 100 is in the OPEN (OFF) state.

If the voltage difference between the control electrode 111 (or 112) and the channel element 115 is removed, the channel element 115 returns to the non-elongated state (see FIG. 1C) if the switching element 100 is designed to operate in the volatile mode, and the electrical connection or path between the electrode 115 to the output node 113 is opened.

Preferably, if the switching element 100 is designed to operate in the non-volatile mode, the channel element is not operated in a manner to attain the state of FIG. 1C. Instead, the electrodes 111 and 112 are expected to be operated so that the channel element 115 will either be in the state of FIG. 1E or 1F.

The output node 113 is constructed to include an isolation structure in which the operation of the channel element 115 and thereby the formation of the channel is invariant to the state of the output node 113. Since in the preferred embodiment the channel element is electromechanically deflectable in response to electrostatically attractive forces, a floating output node 113 in principle could have any potential. Consequently, the potential on an output node may be sufficiently different in relation to the state of the channel element 115 that it would cause deflection of the channel element 115 and disturb the operation of the switching element 100 and its channel formation; that is, the channel formation would depend on the state of an unknown floating node. In the preferred embodiment this problem is addressed with an output node that includes an isolation structure to prevent such disturbances from being caused.

Specifically, the nanotube channel element 115 is disposed between two oppositely disposed electrodes 113*b,d* (and also 113 *a,c*) of equal potential. Consequently, there are equal but opposing electrostatic forces that result from the voltage on the output node. Because of the equal and opposing electrostatic forces, the state of output node 113 cannot cause the nanotube channel element 115 to deflect regardless of the voltages on output node 113 and nanotube channel element 115. Thus, the operation and formation of the channel is made invariant to the state of the output node.

To facilitate the description of such circuits and to avoid the complexity of the layout and physical diagrams of FIGS. 1C-F, a schematic representation has been developed to depict the switching elements.

FIG. 2A is a schematic representation of a nanotube switching element 100 of FIG. 1C. The nodes of the schematic use the same reference numerals with an appended (') to indicate the correspondence between the schematic and the components of nanotube switching element 100. Nodes 114' and 115' represent the signal electrode terminal and nanotube channel element contact. Node 111' represents the control electrode. Node 112' represents the release electrode. Node 113' represent the output electrode.

FIGS. 2B-C depict a nanotube channel element 100 when used in a pull-up arrangement and its states of operation. For example, FIG. 2B is a schematic representation of the nanotube switching element in the OPEN (OFF) state illustrated in FIG. 1E, in which node 114 and the nanotube channel element 115 are at $V_{DD}$, the control electrode 111 is at a positive voltage, typically $V_{DD}$, and the release electrode 112 is at zero volts. The nanotube channel element is not in electrical contact with output node 113. FIG. 2C is a schematic representation of the nanotube switching element in the CLOSED (ON) state illustrated in FIG. 1F. In this case, signal node 114 and the nanotube channel element 115 are at $V_{DD}$, the control electrode 111 is at zero volts, and the release electrode 112 is at a positive voltage, typically $V_{DD}$. The nanotube channel element is deflected into mechanical and electrical contact with the output node 113. Moreover, if as described above, geometries are selected appropriately, the contact will be non-volatile as a result of the Van der Waals forces between the channel element and the insulated control element 111 and the uninsulated portion of the output electrode. The state of electrical contact is depicted by the short black line 204 or 204' representing the nanotube channel element being insulated from (OFF) or electrically contacting (ON) the output terminal 113. Electrical contact results in the output node 113 assuming the same signal (i.e., $V_{DD}$) as the nanotube channel element 115 and signal node 114.

FIGS. 3A-C are analogous to those of FIGS. 2A-C, except that they depict a nanotube switching element 100 and its states when used as a pull-down device.

In FIGS. 2 and 3, the nanotube switching element is always operated in a way (at least when power is applied) that the signals applied to the control electrode 111 and the release electrode 112 are of opposite voltage values. If, for example, control 111 is at zero volts, then release 112 is at a positive voltage, typically $V_{DD}$. If, however, control electrode 111 is at a positive voltage, typically $V_{DD}$, then release electrode 112 is at zero volts. If a positive voltage is associated with a logic "1" state, and a zero voltage is associated with a logic "0" state, then logic states applied to control and release are true and complement, respectively (or complement and true, respectively). The notation adopted for FIGS. 2 and 3 is also used in FIGS. 4 and 5.

Referring again to FIGS. 1A and 1B, in preferred embodiments, FETs 30 and 70 are conventional MOS FETs. NT-FET devices 10 and 50 retain the driving characteristics of MOS devices because FETs 30 and 70 are connected to the respective output nodes 25 and 55. Thus, NT-FET devices 10 and 50 may be readily integrated with and interconnected to conventional CMOS circuitry. In certain embodiments, the interconnect wiring used to interconnect the device terminals to other devices may be conventional wiring such as AlCu, W, or Cu wiring with appropriate insulating layers such as $SiO_2$, polyimide, etc, or may be single or multi-wall nanotubes used for wiring.

In operation, the output signal provided on output terminal 45 of NT-PFET device 10 is controlled by input signal $A_T$ (on control input terminal 40) and its complement $A_C$ (on control input terminal 40'). When $A_T$ is high: (1) both the set electrode (connected to terminal 40) and the nanotube channel element within nanotube switching element 20 are high, and nanotube switching element 20 remains off, and (2) PFET 30 has a high voltage on its gate (connected to terminal 40) and also remains off. Note that since nanotube switching element is not conducting, it acts as a valve and can reduce standby leakage currents in FET 30. When $A_T$ is low: (1) the set electrode is low but the nanotube channel element within nanotube switching element 20 is high, and nanotube switching element 20 turns on; and (2) PFET 30 has a low voltage on its gate and also turns on. When $A_T$ is low, NT-PFET device 10 is ON and the voltage at output terminal 45 is $V_{DD}$. The integrated NT-FET devices and associated structures and logic circuits of the preferred embodiments offer a solution to the CMOS power dissipation problem. There is no significant leakage current between input and output terminals in the "OFF" state of the nanotube switching element, and there is no junction leakage. The use of nanotube switching elements in series with FETs limits the leakage currents in such integrated devices. The nanotube switching element 20, 60 contained within each device 10 and 50 provides a low leakage path when turned off (with power supply still on) even if FET devices 30 and 70 have high OFF-current leakage. The nanotube switching elements may operate in harsh environments such as elevated temperatures, e.g., 150 to 200 deg-C. or higher.

Similarly, the output signal provided on output terminal 85 of NT-NFET device 50 is controlled by input signal $A_T$ (connected to control input terminal 80') and its complement $A_C$ (connected to control input terminal 80) When $A_T$ is low: (1) both the set electrode (connected to terminal 80') and the channel element within nanotube switching element 60 are low, and nanotube switching element is off; and (2) NFET 70 has a low voltage on its gate (connected to terminal 80') and also remains off. When $A_T$ is high: (1) the set electrode is high but the channel element within nanotube switching element 60 is low, and nanotube switching element 60 turns on. When $A_T$ is high, NT-PFET device 60 is ON and the voltage at output terminal 85 is GND.

In preferred embodiments, NT-FET devices 10 and 50 are sized so that they are non-volatile. The nanotube switching element 20, 60 contained within each device 10, 50 provides a non-volatile element that retains the state of the device when power to the device 10, 50 is removed or interrupted. Thus, NT-FET devices 10 and 50 can be used to perform logic operations when activated, preserve the logic state in a nonvolatile mode when powered down and resume operations from the preserved state, without any additional steps or circuitry for saving or restoring the logic states. Alternatively, NT-FET devices 10 and 50 may be sized so that they are volatile.

The NT-FET devices 10 and 50 are integrated at the device level. NT-FET devices 10 and 50 may be operated in a dual-rail differential fashion and can be used as the basic building blocks to provide a non-volatile complementary hybrid NT-FET logic family. NOT and NOR circuits can be formed using techniques described herein and known logic design principles and used be used to implement any logical function.

This hybrid logic family exhibits desirable characteristics of both MOS and NT components. As noted above, this hybrid logic family retains the drive capabilities of conventional CMOS. Operation of the NT-FET devices 10 and 50 as building blocks for a non-volatile dual-rail differential logic family can be further understood by reference to the inverter circuits depicted in FIGS. 4 and 5. The inverter designs are based on the principles taught herein and in the related, incorporated patent references and known logic design principles.

FIG. 4A illustrates the operation of non-volatile NT-PFET device 10 and non-volatile NT-NFET device 50, where non-volatile NT-PFET device 10 and NT-NFET device 50 are connected to form a dual-rail input single-rail output inverter 400. Inverter 400 is formed by connecting terminal 45 of NT-PFET device 10 to terminal 85 of NT-NFET device 50. Connected terminals 45 and 85 form output Aout of inverter 400. Inverter input $A_T$ is connected to the control terminal of switching element 20, the control terminal of switching element 60, and the gate of PFET 30 and the gate of NFET 70. Input $A_C$ is connected to the release electrodes of switches 20 and 60. FIGS. 4B and 4C illustrate input and output voltages, and the position of the nanotube switch.

In operation, FIG. 4B illustrates inverter 400 in logic state 400', where input $A_C$ is at zero volts and input $A_T$ is at a positive voltage, $V_{DD}$ for example, and output Aout is at zero volts. Switch 20 and PFET 30 are in the "OFF" state, and switch 60 and NFET 70 are in the "ON" state. A conductive path is formed through NFET 70 and switch 60 that electrically connects output Aout to ground. PFET 30 and switch 20 are in the "OFF" state, and no path exists between output Aout and voltage $V_{DD}$.

In operation, FIG. 4C illustrates inverter 400 in logic state 400", where input $A_C$ is at a positive voltage, $V_{DD}$ for example, and input $A_T$ is at zero volts, and output Aout is at a positive voltage, $V_{DD}$ for example. Switch 20 and PFET 30 are in the "ON" state, and switch 60 and NFET 70 are in the "OFF" state. A conductive path is formed through PFET 30 and switch 20 that electrically connects output Aout to voltage $V_{DD}$. NFET 70 and switch 60 are in the "OFF" state, and no path exists between output Aout and ground.

Figure 4D:
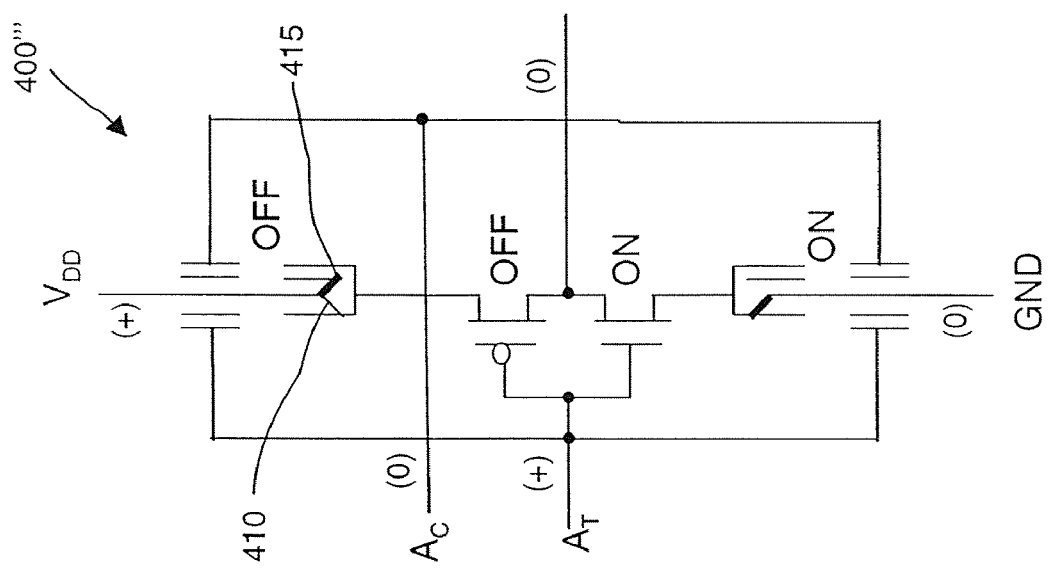
FIG. 4D is a schematic representation of the inverter of FIG. 4A in one possible logic state.

An additional advantage of the hybrid NT-FET device family is illustrated in FIG. 4D. In contrast with FIG. 4B, FIG. 4D illustrates a logic state 400''' in which switch 20 is not completely turned OFF. In this example, one fiber 410 remains connected between the carbon nanotube fabric and the output electrode, while the remaining fibers 415 are no longer in contact with the output electrode. This may occur due to a manufacturing defect, for example. While the output signal will not be affected, fiber 410 will conduct a leakage current. Because PFET 30 is in the "OFF" state, the leakage current of nonvolatile inverter 100 in state 100' remains small. Thus, PFET 30 defines a worst case leakage current.

Figure 5C:
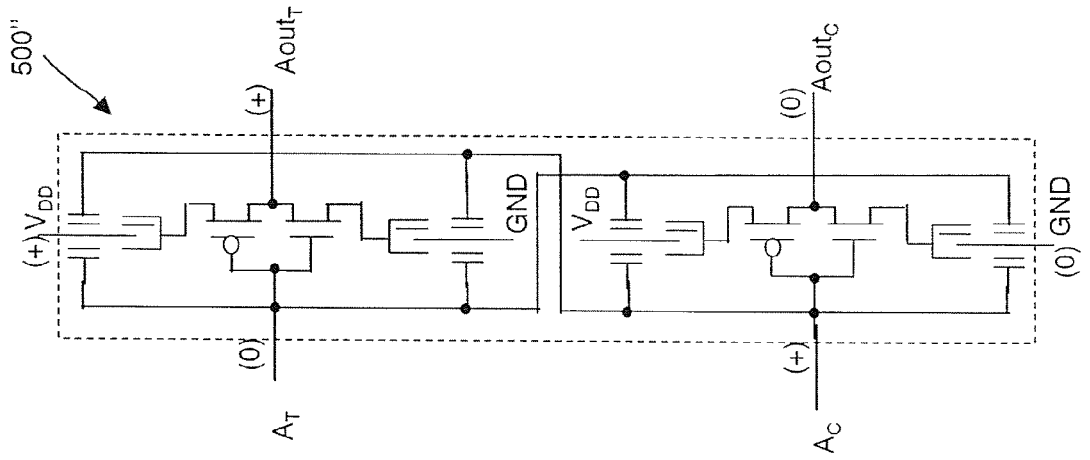
FIG. 5C is a schematic representation of the dual-rail inverter of FIG. 5A in one possible logic state.
Figure 5B:
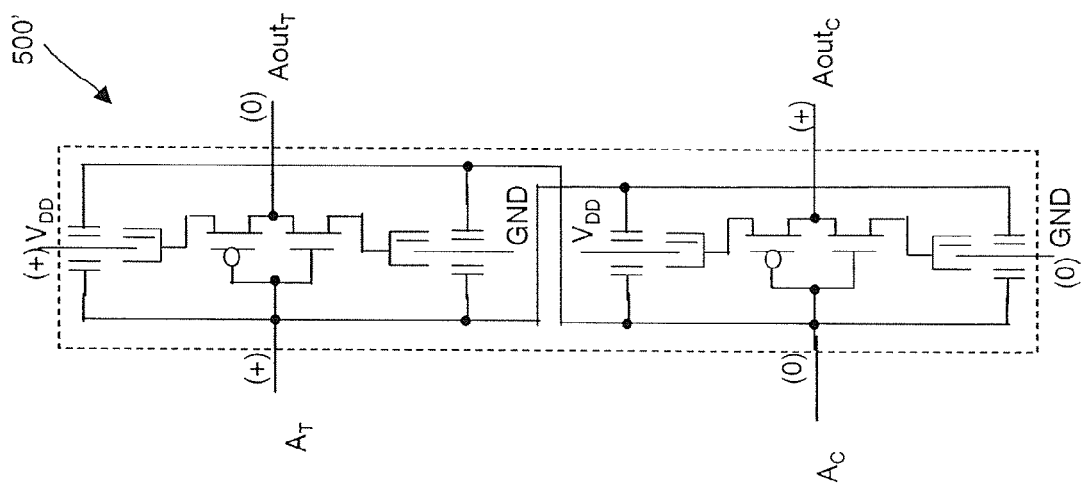
FIG. 5B is a schematic representation of the dual-rail inverter of FIG. 5A in one possible logic state.
Figure 5A:
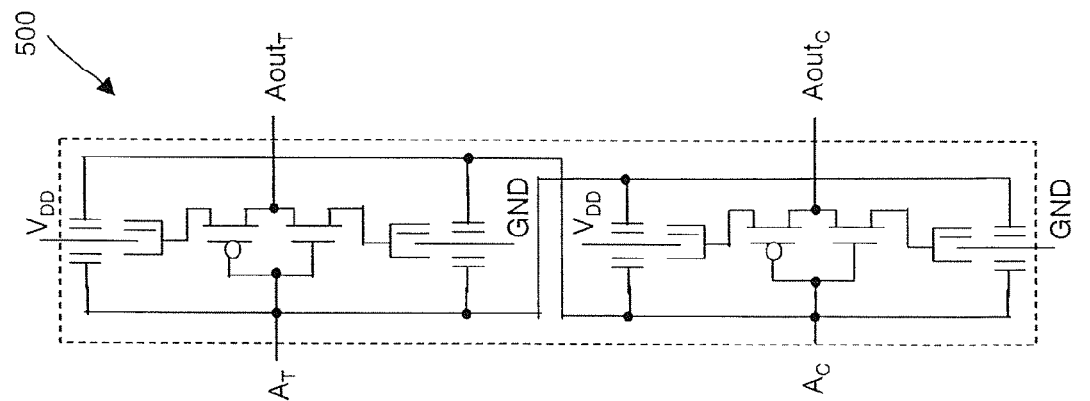
FIG. 5A is a schematic representation of a dual-rail input and output non-volatile inverter constructed using non-volatile integrated NT-PFET devices and non-volatile integrated NT-NFET devices according to one aspect of the invention.

FIG. 5A illustrates a dual-rail input and output nonvolatile inverter 500 formed using two dual-rail input and single-rail output inverters 400 interconnected as shown. In operation, dual-rail inverter 500 is shown in logic state 500' in FIG. 5B, where input $A_T$ is a positive voltage and input $A_C$ is at zero volts, and output Aout$_T$ is at zero volts and output Aout$_C$ is at a positive voltage. Combined nanotube and MOS inverter 500 operates in a nonvolatile mode, that is, the inverter logic state is preserved if power is removed. Inverter 500 also limits leakage currents in cases where nanotube fibers do not all switch to the "OFF" state.

FIG. 5C illustrates operation of dual-rail inverter 500, shown in logic state 500", where input $A_T$ is zero volts and input $A_C$ is at a positive voltage, and output Aout$_T$ is at a positive voltage and output AoutC is zero volts. Combined nanotube and MOS inverter 500 operates in a nonvolatile mode, that is, the inverter logic state is preserved if power is removed. Inverter 500 also limits leakage currents in cases where nanotube fibers do not all switch to the "OFF" state, as illustrated in FIG. 4D.

The switching behavior of some embodiments of NT-FETs has been described in detail herein. NT-FETs can be arranged as pull-up or pull-down structures. These pull-up and pull-down structures can be arranged into gates and larger circuits such as Boolean logic circuits. NOR gates and other logic gates can be constructed using NT-FETs using the layouts discussed in the related, incorporated patent references, together with the present disclosure and conventional pull-up/pull-down techniques from conventional CMOS.

It will also be appreciated that additional implementations or types of NT-FET switching devices can be developed by interconnecting networks of non-volatile switching elements and networks of FETs. While the specification has offered specific examples of the schematic layout of a dual-rail single-output inverter and a dual-rail dual-output inverter, it will be appreciated that the NT-FET building blocks of preferred embodiments may be used to derive a complete logic family that can be used to implement any logical function. It is well known to construct circuits with networks of pull-up and pull-down elements, e.g., CMOS circuits. This technology can also be used to implement latches and other storage devices. The technology can be used in all present memory devices such as DRAM, SRAM, Flash, EEPROM, PROM, ASICs, etc. Also, all logic functions such as microprocessors, controllers, digital signal processors, adders, random logic, PLAs, FPGAs, etc. can be fabricated with this invention. Preferred embodiments of NT-FET devices are compatible with MOS technology and are compatible with MOS at the block or function level. NT-FET devices also enable embedding combined nanotube-based logic and MOS circuits in new and existing MOS (and/or nanotube logic) designs at the individual circuit level.

The devices and articles shown in the preceding embodiments are given for illustrative purposes only, and other techniques may be used to produce the same or equivalents thereof. Furthermore, the articles shown may be substituted with other types of materials and geometries in yet other embodiments. For example, the nanotube switching elements may have any suitable architecture. Architectures of nanotube switches preferred for use in embodiments of the present invention are discussed in U.S. application Ser. Nos. 10/917, 794 and 10/918,085, which are incorporated by reference herein. Although the NT-FET devices are described herein primarily as four-terminal devices, various embodiments may have different configurations. For example, if the nanotube switching element component of an NT-FET device does not have a release electrode, then the NT-FET device may be only a three-terminal device, with only one control input terminal. In various embodiments, the devices may incorporate networks of nanotube switches and/or networks of field-modulatable switches. Any suitable integrated architecture may be used and the use of nanotube or field modulatable switching components with discrete architectures as components is not a limitation of the invention. Certain embodiments may incorporate an electrically conductive channel having a nanotube channel element and a field modulatable semiconductor channel element without using discretely identifiable nanotube and field modulatable switch architectures.

The inventors envision additional configurations of volatile and nonvolatile or mixed nanoelectromechanical designs depending upon the specific application, speed, power requirements and density desired. Additionally the inventors foresee the use of multiwalled carbon nanotubes or nanowires as the switching element of contact points within the nanotube switches. As the technology node decreases in size from 90 nm to 65 nm and below down to the size of individual nanotubes or nanowires the inventors foresee adapting the basic electromechanical switching elements and their operation to a generation of nanoscale devices with scaleable performance characteristics concomitant with such size reduction. It will also be appreciated that the invention is not limited to the use of carbon nanotubes.

The following patent references refer to various techniques for creating nanotube fabric articles and switches and are assigned to the assignee of this application. Each is hereby incorporated by reference in its entirety.

Electromechanical Memory Having Cell Selection Circuitry Constructed With Nanotube Technology (U.S. Pat. No. 6,643,165), filed on Jul. 25, 2001;

Electromechanical Memory Array Using Nanotube Ribbons and Method for Making Same (U.S. patent application Ser. No. 09/915,093), filed on Jul. 25, 2001;

Hybrid Circuit Having Nanotube Electromechanical Memory (U.S. Pat. No. 6,574,130), filed on Jul. 25, 2001;

Electromechanical Three-Trace Junction Devices (U.S. patent application Ser. No. 10/033,323), filed on Dec. 28, 2001;

Methods of Making Electromechanical Three-Trace Junction Devices (U.S. patent application Ser. No. 10/033, 032), filed on Dec. 28, 2001;

Nanotube Films and Articles (U.S. Pat. No. 6,706,402), filed Apr. 23, 2002;

Methods of Nanotube Films and Articles (U.S. patent application Ser. No. 10/128,117), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341, 055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341, 054), filed Jan. 13, 2003;

Carbon Nanotube Films, Layers, Fabrics, Ribbons, Elements and Articles (U.S. patent application Ser. No. 10/341,130), filed Jan. 13, 2003;

Electro-Mechanical Switches and Memory Cells Using Horizontally-Disposed Nanofabric Articles and Methods of Making the Same, (U.S. Provisional Pat. Apl. Ser. No. 60/446,783), filed Feb. 12, 2003; now Devices Having Horizontally-Disposed Nanofabric Articles and Methods of Making the Same (U.S. patent application Ser. No. 10/776,059), filed Feb. 11, 2004;

Electromechanical Switches and Memory Cells using Vertically-Disposed Nanofabric Articles and Methods of Making the Same (U.S. Provisional Pat. Apl. Ser. No. 60/446,786), filed Feb. 12, 2003; now Devices Having Vertically-Disposed Nanofabric Articles and Methods of Making the Same (U.S. patent application Ser. No. 10/776,572), filed Feb. 11, 2004.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A nonvolatile switching device comprising:
an input terminal able to receive an input signal;
an output terminal in electrical communication with a circuit to be controlled;
a control structure, electrical stimulation of the control structure controlling the formation of an electrically conductive channel between the signal input terminal and the output terminal, a first portion of the electrically conductive channel including a nanotube channel element and a second portion of the electrically conductive channel including a field modulatable semiconductor channel element;
wherein the formation of the electrically conductive channel allows propagation of the input signal to the output.

2. The nonvolatile switching device of claim 1, wherein a first control terminal of the control structure carries a first electrical signal and a second control terminal of the control structure carries a second electrical signal, the second electrical signal comprising the logical complement of the first electrical signal.

3. The nonvolatile switching device of claim 2, wherein the electrically conductive channel is formed and the circuit to be controlled is responsive to electrical stimulus on the input terminal.

4. The nonvolatile switching device of claim 2, wherein the input terminal comprises a power supply.

5. The nonvolatile switching device of claim 4, wherein the electrically conductive channel is unformed and the circuit to be controlled is disconnected from the power supply.

6. The nonvolatile switching device of claim 1, wherein the control structure comprises a first terminal carrying a first electrical signal and a second terminal carrying a second electrical signal, the second electrical signal approximately equal to the first electrical signal.

7. The nonvolatile switching device of claim 6, wherein when the electrically conductive channel is formed, said channel is nonvolatilely preserved and unresponsive to electrical stimulus at the input terminal.

8. The nonvolatile switching device of claim 7, wherein the input terminal comprises a power supply and wherein the circuit to be controlled is connected to the power supply.

9. The nonvolatile switching device of claim 6, wherein when the electrically conductive channel is unformed, said channel is nonvolatilely preserved and unresponsive to electrical stimulus at the input terminal.

10. The nonvolatile switching device of claim 9, wherein the input terminal comprises a power supply and wherein the circuit to be controlled is disconnected from the power supply.

11. The nonvolatile switching device of claim 1, wherein the circuit to be controlled comprises a CMOS circuit.

12. The nonvolatile switching device of claim 1, where the nanotube channel element comprises an electromechanically deflectable nanotube article in electrical communication with the input terminal, the nanotube article having a first and a second positional state controllably induced by the control structure.

13. The nonvolatile switching device of claim 1, wherein the field modulatable semiconductor channel element comprises one of a PFET and a NFET.

14. The nonvolatile switching device of claim 1, wherein the field modulatable semiconductor channel element includes a gate region, a source region, a drain region and a channel region disposed between the source region and the drain region, electrically responsive to the gate region.

15. The nonvolatile switching device of claim 14, wherein the nanotube channel element is in electrical communication with the source region of the field modulatable semiconductor channel element.

16. The nonvolatile switching device of claim 14, wherein the gate region of the field modulatable semiconductor channel element is in electrical communication with one of a first and a second terminal of the control structure.

17. The nonvolatile switching device of claim 1 wherein the first portion of the electrically conductive channel is formed in response to a first threshold voltage and the second portion of the electrically conductive channel is formed in response to a second threshold voltage, the first threshold voltage being greater than the second threshold voltage.

* * * * *